(12) United States Patent
Bartoli et al.

(10) Patent No.: US 7,404,049 B2
(45) Date of Patent: Jul. 22, 2008

(54) METHOD AND SYSTEM FOR MANAGING ADDRESS BITS DURING BUFFERED PROGRAM OPERATIONS IN A MEMORY DEVICE

(75) Inventors: Simone Bartoli, Cambiago (IT); Stefano Surico, Milan (IT); Davide Manfre', Bologna (IT); Donato Ferrario, Carugate (IT)

(73) Assignee: Atmel Corporation, San Jose, CA (US)

( * ) Notice: Subject to any disclaimer, the term of this patent is extended or adjusted under 35 U.S.C. 154(b) by 111 days.

(21) Appl. No.: 11/123,682

(22) Filed: May 6, 2005

(65) Prior Publication Data

US 2006/0085622 A1 Apr. 20, 2006

(30) Foreign Application Priority Data

Oct. 15, 2004 (IT) .......................... MI2004A1968

(51) Int. Cl.
*G06F 12/00* (2006.01)
(52) U.S. Cl. .................. 711/154; 711/165; 711/212
(58) Field of Classification Search .................. None
See application file for complete search history.

(56) References Cited

U.S. PATENT DOCUMENTS

| | | | |
|---|---|---|---|
| 4,839,796 A * | 6/1989 | Rorden et al. ............... 711/157 |
| 6,172,906 B1 | 1/2001 | Estakhri et al. | |
| 6,185,134 B1 | 2/2001 | Tanaka | |
| 6,466,508 B1 * | 10/2002 | Miyawaki et al. ...... 365/230.03 |
| 6,553,474 B2 * | 4/2003 | Ito et al. ...................... 711/201 |
| 6,584,034 B1 | 6/2003 | Hsu et al. | |
| 2003/0206455 A1 | 11/2003 | Hsu et al. | |
| 2003/0206456 A1 | 11/2003 | Hsu et al. | |
| 2005/0057995 A1 * | 3/2005 | Mitani et al. ................. 365/222 |

\* cited by examiner

*Primary Examiner*—Reginald Bragdon
*Assistant Examiner*—Horace L. Flournoy
(74) *Attorney, Agent, or Firm*—Schwegman, Lundberg & Woessner P.A.

(57) ABSTRACT

A method and system for managing a buffered program operation for plurality of words is described. In one aspect, the method and system include providing an internal buffer including a plurality of locations and at least one bit location for the plurality of locations. Each of the words is stored in a location of the plurality of locations. The words are associated with internal address bits for the locations. At least one of the internal address bits is at least one group address bit that corresponds to all of the words. A remaining portion of the internal address bits is associated at least one of the words. The at least one bit location stores the at least one group address bit for the words. Thus, in one aspect, the method and system include storing each of the words one of the buffer locations. The method and system also include associating the at least one group address bit with the buffer location for each of the words.

19 Claims, 3 Drawing Sheets

METHOD AND SYSTEM FOR MANAGING ADDRESS BITS DURING BUFFERED PROGRAM OPERATIONS IN A MEMORY DEVICE

CROSS-REFERENCE TO RELATED APPLICATIONS

This application claims benefit under 35 USC 119 of Italian Application no. MI2004A 001968, filed on Oct. 15, 2004.

FIELD OF THE INVENTION

The present invention relates to buffered memory program operations and more particularly to a method and system for managing addressing in buffered program operations in a flash memory device.

BACKGROUND OF THE INVENTION

Buffered program operations are used in memory devices, such as flash memories. Typically a buffered program operation allows multiple words, typically up to thirty-two words, to be programmed without wait states. In order to do so, an internal buffer is used. The internal buffer is used because physical programming operations are typically much slower than external timing.

In order to perform buffered programming, a write setup command is typically provided to the internal buffer. Words may then be sent to the internal buffer. In addition, the address of the first word is provided. The words are then temporarily stored in the internal buffer, then written to the memory.

In order manage the words written to the internal buffer, internal address bits are generated to define the words' positions in the internal buffer. For internal buffers capable of writing thirty-two words, five internal address bits A0, A1, A2, A3 and A4 are used. In addition, another bit, the A5 bit, termed a group bit herein, may be used to indicate a particular group of words stored in the buffer. Using the internal address bits, the internal buffer can reference the words to be written.

The addressing scheme can be used for performing aligned buffered program operations because A5 is the same for all words being programmed. However, one of ordinary skill in the art will readily recognize that misaligned buffered program operations are problematic. In particular, misaligned buffer operations may write different groups of words. Thus, in misaligned buffered program operations, the A5 bit can change. A mechanism for accounting for the changing value of the A5 bit needed.

FIG. 1 depicts a conventional double internal buffer 10 used in performing misaligned buffered program operations. The double internal buffer 10 includes two buffers 20 and 30. For the buffer 20, thirty-two locations 21 are provided for storing up two thirty-two words. Also depicted are validity bit locations 22 that are used for storing a validity bit for each of the locations 21. Similarly, for the buffer 30, thirty-two locations 31 are provided for storing up two thirty-two words. Also depicted are validity bit locations 32 that are used for storing a validity bit for each of the locations 31. For the buffer 20, bits A0, A1, A2, A3, and A4 are used for internal addressing. Similarly, for the buffer 30, bits A0, A1, A2, A3, and A4 are used for internal addressing. Bit A5 is used to select between buffer 20 and buffer 30. For the first buffer 20, the bit A5 is a zero. For the second buffer 30, the A5 is a one. Because two buffers 20 and 30, each of which uses internal addressing, are utilized, misaligned buffer operations in which the words from both buffers 20 and 30 having different values of A5 can be performed. In particular, the word to be programmed in a memory location which has A5=1 will be stored in the buffer 30, the word to be programmed in a memory location with A5=0 will be stored in the buffer 20.

Although the conventional internal double buffer 10 allows for misaligned buffered program operations to be performed, one of ordinary skill in the art will readily recognize that the conventional internal double buffer 10 has significant drawbacks. The conventional internal double buffer 10 consumes significantly more circuit area than a conventional internal buffer that is a single buffer. In addition, buffered program operations take longer to complete. This is because a user can perform buffered program operations without being effectively limited in the number of programmable words. Thus, it cannot be determined whether a particular buffer 20 or 30 contains a valid word to be programmed without reading the entire double buffer 10. Thus all of the locations 21 and 31 in the double buffer 10 are traversed and it is determined, using the validity bit, whether each of the locations 21 and 31 stores a word to be programmed. Consequently, not only does the conventional double internal buffer 10 consume more space, but is also requires a longer time to complete a programming operation. Note that it is not necessary to memorize the A5, A4, A3, A2, A1 and A0 address bits of the word to be programmed because this information is obtained by the word position in the buffer 10.

Accordingly, what is needed is a mechanism for more efficiently performing misaligned buffered program operations while allowing the internal buffer to consume less area. The present invention addresses such a need.

BRIEF SUMMARY OF THE INVENTION

The present invention provides a method and system for managing a buffered program operation for plurality of words. In one aspect, the method and system comprise providing an internal buffer including a plurality of locations and at least one bit location for the plurality of locations. Each of the words is stored in a location of the plurality of locations. The words are associated with internal address bits for the locations. At least one of the internal address bits is at least one group address bit that corresponds to all of the words. A remaining portion of the internal address bits is associated at least one of the words. The at least one bit location stores the at least one group address bit for the words. Thus, in one aspect, the method and system comprise storing each of the words in one of the buffer locations. The method and system also comprise associating the at least one group address bit with the buffer location for each of the words.

According to the method and system disclosed herein, the present invention allows buffered program operations to be more rapidly performed and allows the internal buffer to consume less area.

DETAILED DESCRIPTION OF THE INVENTION

The present invention relates to memory devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for managing a buffered program operation for plurality of words. In one aspect, the method and system comprise providing an internal buffer including a plurality of locations and at least one bit location for the plurality of locations. Each of the words is stored in a location of the plurality of locations. The words are associated with internal address bits for the locations. At least one of the internal address bits is at least one group address bit that corresponds to all of the words. A remaining portion of the internal address bits is associated at least one of the words. The at least one bit location stores the at least one group address bit for the words. Thus, in one aspect, the method and system comprise storing each of the words in one of the buffer locations. The method and system also comprise associating the at least one group address bit with the buffer location for each of the words.

The present invention will be described in terms of a particular buffer storing a particular number of words. However, one of ordinary skill in the art will readily recognize that the method and system are consistent with the use of another buffer storing a different number of words. Similarly, the present invention is described in the context of a particular addressing scheme utilizing six bits. However, one of ordinary skill in the art will readily recognize that the method and system are consistent with the use of another addressing scheme using another number of bits.

Figure 1:
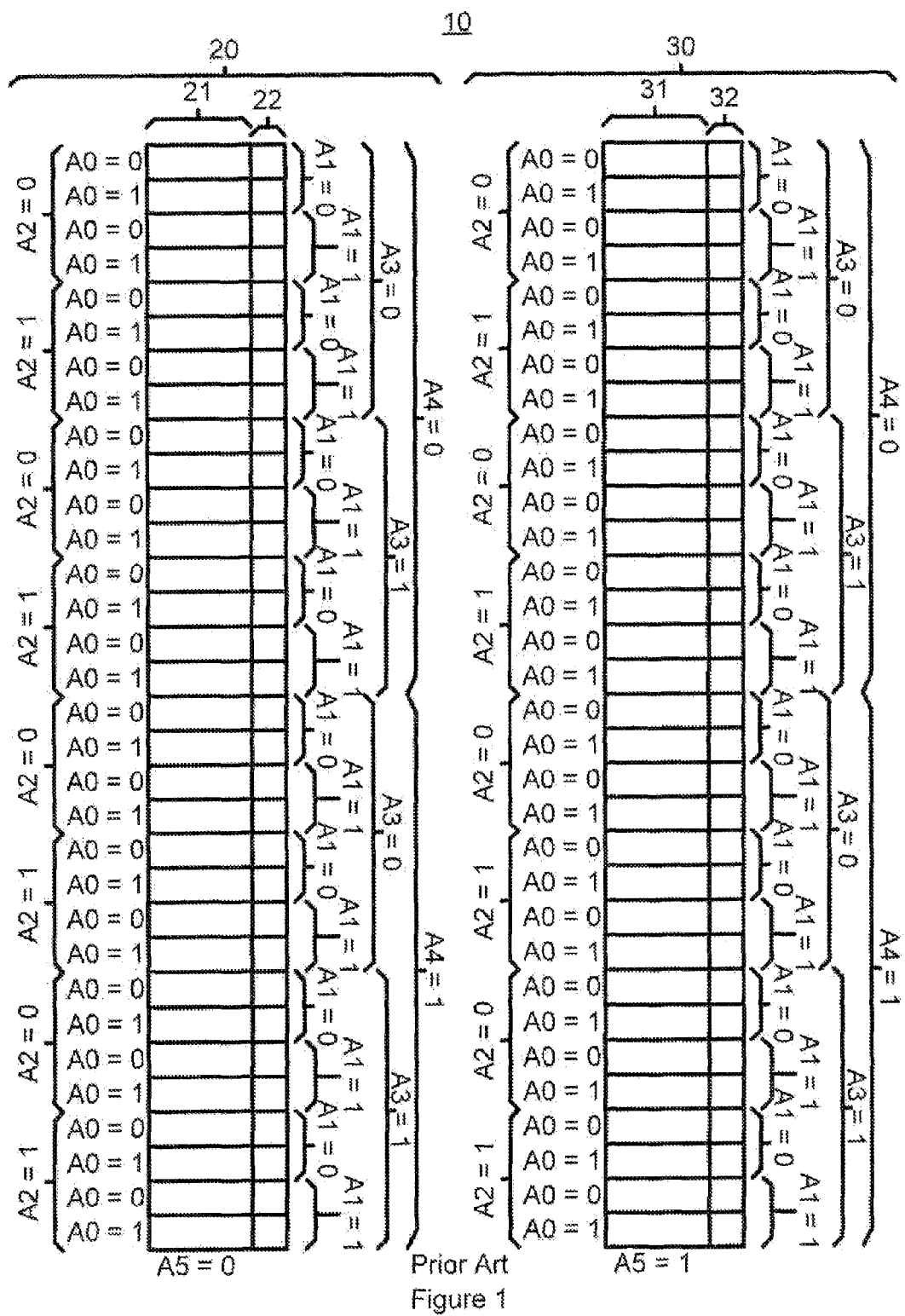
FIG. 1 is a diagram of a conventional double buffer capable of performing misaligned buffered program operations.
Figure 2:
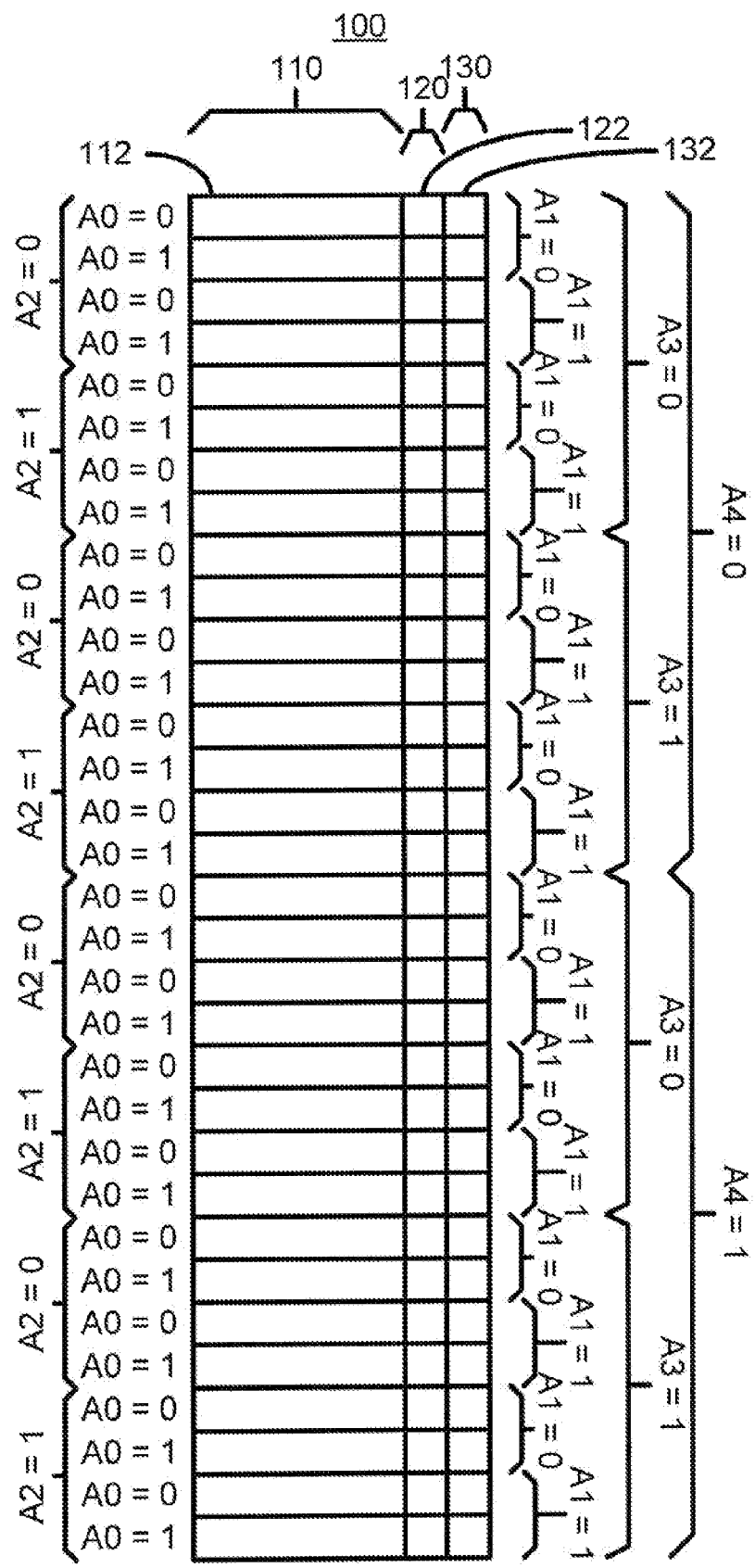
FIG. 2 is a block diagram depicting one embodiment of a system in accordance with the present invention capable of performing misaligned buffer operations.

To more particularly describe the present invention, refer to FIG. 2 depicting one embodiment of a system 100 in accordance with the present invention capable of performing misaligned buffer operations. The system 100 is preferably used for performing buffered program operations in a flash memory. However, nothing prevents the system 100 from being used in connection with another memory (not shown). The system 100 can be considered to be an internal buffer 100 including location 110. In the embodiment shown, there are thirty-two locations 110, each of which can store a word. However, nothing prevents the use of another number of locations and/or storing another number of words. The internal buffer 100 also includes validity bit locations 120 and group bit locations 130. In a preferred embodiment, there is a one-to-one correspondence between the locations 110 and the group bit locations 130. Stated differently, each individual location 112 has an associated group bit location 132. Similarly, each location 112 has a corresponding valid bit location 122.

FIG. 2 also depicts the addressing scheme including internal address bits A0, A1, A2, A3, A4, and A5. The A5 bit is the group bit, which identifies the group of words to which a particular word belongs. The remaining internal bits, A0, A1, A2, A3, and A4 correspond to the portions of the locations 110 shown. Thus, the internal bits A0-A4 can uniquely identify the position of a particular word in the internal buffer 100. When combined with the A5 bit, the words and how they are grouped are uniquely identified in the internal buffer 100.

The validity bit locations 120 and group bit locations 130 are used to store the validity bits and A5 bit, respectively, for the words. In a preferred embodiment, there is a one-to-one correspondence between the locations 110 and the group bit locations 130. Stated differently, each individual location 112 has an associated group bit location 132. Similarly, each location 112 has a corresponding valid bit location 122. The group bit for the words being programmed is stored for each word in the group bit location 132 corresponding to the location 112 at which the word is stored. Similarly, the valid bit is stored in the valid bit location for each word being programmed in the valid bit location 122 corresponding to the location 112 at which the word is stored.

Misaligned programming operations can be performed using the internal buffer 100. In operation, a particular one of the locations 110 could be read and, if the validity bit stored in the corresponding one of the locations 120 is valid, the word can be programmed. The correct A5 value of the word can be provided by the internal buffer 100 because the A5 value is stored in the group bit locations 130 while the correct A4, A3, A2, A1 and A0 values are obtained by word position in the buffer 100. Moreover, misaligned buffer operations can be performed without requiring a significantly longer time and without the internal buffer 100 consuming a significantly larger area. In particular, because of the use of the group bit locations 130, only a single internal buffer 100 is used. Consequently, the programming operation requires less time because two buffers need not be read. Furthermore, the internal buffer 100 consumes significantly less area (approximately fifty-percent less in one embodiment) than the conventional double buffer 10.

Figure 3:
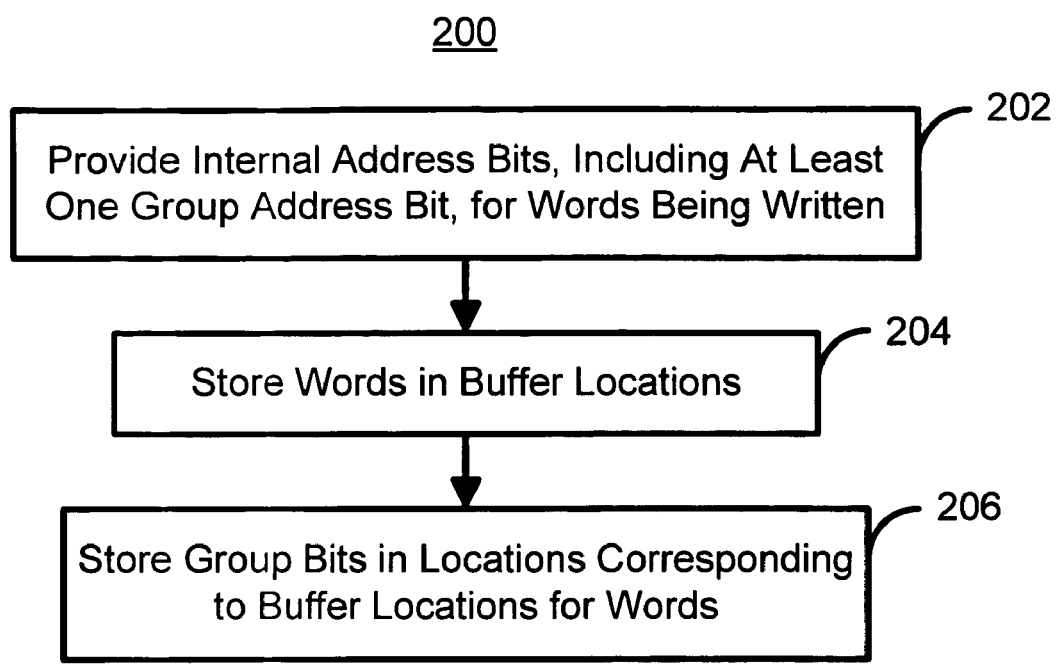
FIG. 3 is a high-level flow chart depicting one embodiment of a method in accordance with the present invention for using an internal buffer capable of performing misaligned buffer operations.

FIG. 3 is a high-level flow chart depicting one embodiment of a method 200 in accordance with the present invention for using an internal buffer capable of performing misaligned buffer operations. The method 200 is described in the context of the buffer 100. However, nothing prevents the use of the method 200 with another system (not shown). For example, the method 200 is described in the context of thirty-two possible locations for storing words in the buffer 100 and internal address bits A0, A1, A2, A3, A4, and A5. However, another number of locations and addressing scheme might be used. The method 200 preferably commences after the write setup command has been provided.

The internal address bits for a plurality of words being programmed are provided, via step 202. In a preferred embodiment, the internal address bits are some combination of values for A0, A1, A2, A3, A4, and A5. Note that if less than all of the locations 110 in the memory 100 are used to store the words, not all combinations of the internal address bits A0, A1, A2, A3, A4, and A5 are used. Step 202 also includes defining at least one of the internal address bits, A5 in this example, as the group bit. The remaining internal address bits, A0, A1, A2, A3, and A4, indicate the relative locations of the words in the buffer 100. Each of the words desired to be programmed are stored in one of the buffer locations 110, via step 204. Note if less than thirty-two words are to be programmed, then fewer than all of the locations 110 are used in step 204. The value of the A5 bit is stored in the appropriate buffer locations 130 for each the words, via step 206. Thus, each of the locations 110 that stores a word has a corresponding one of the group bit locations 130 that stores the value of the A5 bit.

Using the method 200, misaligned programming operations can be performed with an internal buffer such as the internal buffer 100. The programming operation thus requires less time because two buffers need not be read. Furthermore, the internal buffer 100 used in conjunction with the method 200 may consume significantly less area than the conventional double buffer 10.

A method and system for performing buffered program operations has been disclosed. The present invention has been described in accordance with the embodiments shown, and one of ordinary skill in the art will readily recognize that there could be variations to the embodiments, and any variations would be within the spirit and scope of the present invention. Software written according to the present invention is to be stored in some form of computer-readable medium, such as memory, CD-ROM or transmitted over a network, and executed by a processor. Consequently, a computer-readable medium is intended to include a computer readable signal which, for example, may be transmitted over a network. Accordingly, many modifications may be made by one of ordinary skill in the art without departing from the spirit and scope of the appended claims.

We claim:

1. A single internal buffer for managing a buffered program operation for a plurality of words comprising:
   a plurality of locations, each of the plurality of words being stored in a location of the plurality of locations, the plurality of words being associated with a plurality of internal address bits for the plurality of locations, at least one of the plurality of internal address bits being at least one group address bit corresponding to all of the plurality of words, a remaining portion of the plurality of internal address bits being associated at least one individual word in the plurality of words, the at least one group address bit and the plurality of internal address bits uniquely identifying the location of each of the plurality of words, each of the plurality of words including a plurality of bits;
   at least one bit location for the plurality of locations, the at least one bit location storing the at least one group address bit for the plurality of words, wherein a misaligned programming operation can be performed by storing a correct value of one address bit in the at least one group but location and the remaining values of the internal address bits are obtained by word position by the single internal buffer.

2. The single internal buffer of claim 1 wherein the at least one bit location includes a plurality of bit locations.

3. The single internal buffer of claim 2 wherein each of the plurality of bit locations correspond to one of the plurality of locations.

4. The single internal buffer of claim 3 wherein the at least one group address bit for each of the plurality of words is stored each of the plurality of bit locations.

5. The single internal buffer of claim 1 further comprising:
   a plurality of valid bit locations corresponding to the plurality of locations.

6. The single internal buffer of claim 1, wherein the at least group address bit is a single group address bit and wherein the at least one bit location includes a single bit location for each of the plurality of locations.

7. The single internal buffer of claim 6 wherein the plurality of internal address bits uniquely identify each location within the plurality of locations and wherein the single group address bit corresponds to the plurality of locations.

8. The single internal buffer of claim 1 wherein the internal buffer is configured for misaligned buffer operations.

9. A method for managing a program operation for a plurality of words using a single internal buffer, the single internal buffer including a plurality of buffer locations, comprising:
   providing a plurality of internal address bits for the plurality of words, at least one of the plurality of internal address bits being at least one group address bit corresponding to all of the plurality of words, a remaining portion of the plurality of internal address bits corresponding to at least one word of the plurality of words, the at least one group address bit and the plurality of internal address bits uniquely identifying the location of each of the plurality of words, each of the plurality of words including a plurality of bits;
   storing each of the plurality of words in a buffer location of the plurality of buffer locations; and
   associating the at least one group address bit with the buffer location for each of the plurality of words, wherein a misaligned programming operation can be performed by storing a correct value of one address bit in the at least one group but location and the remaining values of the internal address bits are obtained by word position by the single internal buffer.

10. The method of claim 9 wherein the at least one bit location includes a plurality of bit locations and wherein the associating further includes:
    associating the at least one group address bit with the plurality of locations.

11. The method of claim 10 wherein each of the plurality of bit locations corresponds to one of the plurality of locations.

12. The method of claim 9 further comprising:
    storing a valid bit for each of the plurality of words in a valid bit location corresponding to each of the plurality of locations.

13. The method of claim 9 wherein the at least group address bit is a single group address bit and wherein the at least one bit location includes a single bit location for each of the plurality of locations.

14. The method of claim 13 wherein the plurality of internal address bits uniquely identify each location within the plurality of locations and wherein the single group address bit corresponds to the plurality of locations.

15. The method of claim 13 wherein the single internal buffer is configured for misaligned buffer operations.

16. A method for providing a single internal buffer for managing a buffered program operation for a plurality of words comprising:
    providing a plurality of locations, each of the plurality of words being stored in a location of the plurality of locations, the plurality of words being associated with a plurality of internal address bits for the plurality of locations, at least one of the plurality of internal address bits being at least one group address bits being at least one group address bit corresponding to all of the plurality of words, a remaining portion of the plurality of internal address bits being associated at least one individual word in the plurality of words, the at least one group address bit and the plurality of internal address bits uniquely identifying the location of each of the plurality of words, each of the plurality of words including a plurality of bits;
    providing at least one bit location for the plurality of locations, the at least one bit location storing the at least one group address bit for the plurality of words, wherein a misaligned programming operation can be performed by storing a correct value of one address bit in the at least one group but location and the remaining values of the internal address bits are obtained by word position by the single internal buffer.

17. The method of claim 16 wherein the at least group address bit is a single group address bit and wherein the at least one bit location includes a single bit location for each of the plurality of locations.

18. The method of claim 17 wherein the plurality of internal address bits uniquely identify each location within the plurality of locations and wherein the single group address bit corresponds to the plurality of locations.

19. The method of claim 16 wherein the internal buffer is configured for misaligned buffer operations.

* * * * *

UNITED STATES PATENT AND TRADEMARK OFFICE
CERTIFICATE OF CORRECTION

| | |
|---|---|
| PATENT NO. | : 7,404,049 B2 |
| APPLICATION NO. | : 11/123682 |
| DATED | : July 22, 2008 |
| INVENTOR(S) | : Bartoli et al. |

It is certified that error appears in the above-identified patent and that said Letters Patent is hereby corrected as shown below:

On the title page, item (57), under "Abstract", in column 2, line 10, after "associated" insert -- with --.

On the title page, item (57), under "Abstract", in column 2, line 13, after "words" insert -- in --.

In column 1, line 49, after "bit" insert -- is --.

In column 5, line 50, in Claim 4, delete "stored each" and insert -- stored-in-each --, therefor.

In column 5, line 54, in Claim 6, after "at least" insert -- one --.

In column 6, line 32, in Claim 13, after "at least" insert -- one --.

In column 6, lines 51-52, in Claim 16, after "address" delete "bits being at least one group address".

In column 7, line 1, in Claim 17, after "at least" insert -- one --.

Signed and Sealed this

Twenty-first Day of October, 2008

JON W. DUDAS
*Director of the United States Patent and Trademark Office*